United States Patent [19]
Davanloo et al.

[11] Patent Number: 5,478,650
[45] Date of Patent: Dec. 26, 1995

[54] NANOPHASE DIAMOND FILMS

[75] Inventors: Farzin Davanloo, Dallas; Carl B. Collins, Richardson, both of Tex.

[73] Assignee: Board of Regents, The University of Texas System, Austin, Tex.

[21] Appl. No.: 433,937

[22] Filed: May 2, 1995

Related U.S. Application Data

[60] Division of Ser. No. 42,104, Apr. 1, 1993, Pat. No. 5,411, 797, and a continuation-in-part of Ser. No. 821,642, Jan. 16, 1992, which is a division of Ser. No. 521,694, May 9, 1990, Pat. No. 5,098,737, said Ser. No. 42,104is a continuation-in-part of Ser. No. 602,155, Oct. 22, 1990, which is a continuation-in-part of Ser. No. 521,694, May 9, 1990, Pat. No. 5,098,737, which is a continuation-in-part of Ser. No. 264,224, Oct. 28, 1988, abandoned, which is a continuation-in-part of Ser. No. 183,022, Apr. 18, 1988, Pat. No. 4,987, 007.

[51] Int. Cl.$^6$ ........................................ B05D 3/06
[52] U.S. Cl. ...................... 428/408; 428/457; 423/446
[58] Field of Search ......................... 428/408; 423/446

[56] References Cited

U.S. PATENT DOCUMENTS

| | | | |
|---|---|---|---|
| 3,406,349 | 10/1968 | Swain et al. | 250/423 PX |
| 4,248,909 | 2/1981 | Whittaker | 73/863.21 |
| 4,281,030 | 7/1981 | Silfvast | 427/566 |
| 4,370,176 | 1/1983 | Bruel | 437/16 |
| 4,664,769 | 5/1987 | Cuomo et al. | 204/192.1 |
| 4,664,940 | 5/1987 | Bensoussan et al. | 204/192.1 |
| 4,701,592 | 10/1987 | Cheung | 219/121.77 |
| 4,822,466 | 4/1989 | Rabalais et al. | 204/192.15 |
| 4,871,581 | 10/1989 | Yamazaki | 427/571 |
| 4,898,748 | 2/1990 | Kruger, Jr. | 427/577 |
| 4,971,667 | 11/1990 | Yamazaki et al. | 204/192.32 |
| 4,987,007 | 1/1991 | Wagal et al. | 427/526 |
| 4,992,298 | 2/1991 | Deutchman et al. | 427/524 |
| 5,055,318 | 10/1991 | Deutchman et al. | 423/446 |
| 5,066,515 | 11/1991 | Ohsawa | 423/446 |
| 5,094,915 | 3/1992 | Subramaniam | 428/408 |

FOREIGN PATENT DOCUMENTS

| | | |
|---|---|---|
| 2155042 | 9/1985 | United Kingdom. |
| 8910427 | 11/1989 | WIPO. |

OTHER PUBLICATIONS

Collins, et al., "Microstructural and Mechanical Properties of Amorphic Diamond," *Diamond Films and Technology*, vol. 2, No. 1, pp. 25–49 (1992).

Collins, et al., "Microstructural Analyses of Amorphic Diamond, i–C, and Amorphous Carbon," *J. App. L. Phys.*, 72(1):239–245 (Jul. 1, 1992).

Davanloo, et al., "Laser Plasma Diamond," *J. Mater. Res.*, vol. 5, No. 11, pp. 2398–2404 (Nov. 11, 1990).

Collins, et al., "Preparation and Study of Laser Plasma Diamond," *Surface and Coatings Technology*, 47:244–251 (1991).

Collins, et al., "Textured Structure of Diamond-Like Carbon Prepared without Hydrogen," *Surface and Coatings Technology*, 47:754–760 (1991).

(List continued on next page.)

Primary Examiner—Archene Turner
Attorney, Agent, or Firm—Arnold, White & Durkee

[57] ABSTRACT

Films of nanometer-scale nodules of diamond-bonded carbon structures are disclosed. Such films may be used, for example, to coat objects to improve their resistance to wear. Moreover, because the nanophase diamond films of the present invention are of optical quality, they may be used to coat optical lenses and the like. The nanophase diamond films of the present invention have diamond-like properties, indicating a preponderance of $sp^3$ bonds within the nodules and a substantial absence of hydrogen and graphite within the nodules. If desired, the nanophase diamond films disclosed herein may be created to have a hardness exceeding that of natural diamond, depending on the quantity of graphite left in the voids between the nodules. The nanophase diamond films of the present invention are also characterized by a low coefficient of friction, by low average internal stress, and by an optical quality capable of providing a visual appearance of Newton's rings of interference.

4 Claims, 5 Drawing Sheets

OTHER PUBLICATIONS

Collins, et al., "Microstructure of Amorphic Diamond Films," *J. Appl. Phys.* 69(11), pp. 7862–7870 (Jun. 1, 1991).

Davanloo, et al., "Adhesion and Mechanical Properties of Amorphic Diamond Films Prepared by a Laser Plasma Discharge Source," *J. Appl. Phys.* 71(3), pp. 1446–1453 (Feb. 1, 1992).

Collins, et al., "Microstructural Analyses of Amorphic Diamond, Quenched–Ion Diamond and Amorphous Carbon," Center for Quantum Electronics, Dallas, Texas (no date).

Collins, et al., "Microstructural and Mechanical Properties of Amorphic Diamond," Center for Quantum Electronics, Dallas, Texas (no date).

McKenzie, et al., "Properties of Tetrahedral Amorphous Carbon Prepared by Vacuum Arc Deposition," *Diamond and Related Materials,* vol. 1, pp. 51–59 (1991).

"Low Pressure/High Pressure & Temperature Synthesis Diamond, Diamond–Like, and Related Materials Applications, Markets, and Funding Issues Worldwide," *Diamond Depositions: Science and Technology,* vol. 2, No. 2, pp. 19–20 (Apr. 22, 1991).

Narayan, et al. "Laser Method for Synthesis and Processing of Continuous Diamond Films on Nondiamond Substrates," *Science,* vol. 253, pp. 416–418 (Apr. 19, 1991).

Angus, et al., "Diamondlike Films; Composition, Structure and Relationship to Crystalline Diamond," presented at 2nd International Conference on the New Diamond Science and Technology, MRS and Japan New Diamond Forum, Washington, D.C. (Sep. 24–27, 1990).

Kitahama, et al., "Synthesis of Diamond by Laser–Induced Chemical Vapor Deposition," *Appl. Phys. Lett.,* 49(11):634–635 (1986).

Messier, et al., "From Diamond–Like Carbon to Diamond Coatings," Thin Solid Films, 153:1–9 (1987).

Kitabatake, et al. "Growth of Diamond at Room Temperature by an Ion–Beam Sputter Deposition Under Hydrogen–Ion Bombardment," *J. Appl. Phys.,* 58(4):1693–1695 (1985).

Sato, et al., "Deposition of Diamond–Like Carbon Films by Pulsed–Laser Evaporation," *Japanese J. of App. Phys.* 26(9):L1487–L–1488 (1987).

Mirtich, et al., "Diamondlike Carbon Protective Coatings for IR Materials," N.A.S.A. publication (no date).

Angus, et al., "Low–Pressure, Metastable Growth of Diamond and 'Diamond–like' Phases," *Science,* 241:913–921 (1988).

Richter et al., "About the Structure and Bonding of Laser Generated Carbon Films By Raman and Electron Energy Loss Spectroscopy," *J. Non–Crystalline Solids,* 88:131–144 (1986).

Sato, et al., "Diamond–Like Carbon Films Prepared by Pulse–Laser Evaporation," *Appl. Phys., A* 45:3514 360 (1988).

Nagel, et al., "Deposition of Amorphous Carbon Films From Laser–Produced Plasmas," *Mat. Res. Soc. Symp. Proc.,* 38:325–335 (1985).

Cheung, et al., "Growth of Thin Films by Laser–Induced Evaporation," *Critical Review in Solid State and Material Sciences,* 15(1):63–109 (1988).

R. Nemanich, et al., "Raman scattering characterization of carbon bonding in diamond and diamondlike thin films," *J. Vac. Sci. Technol.* A 6(3):1783–1787 (1988).

Berger, et al., "EELS analysis of vacuum arc–deposited diamond–like films," *Philosophical Magazine Letters,* 57(6):285–290 (1988).

R. Shroder, et al., "Analysis of the composite structures in diamond thin films by Raman spectroscopy," *Physics Review B.,* vol. 41, No. 6, (Feb. 15, 1990–II), pp. 3738–3745.

N. Savvides, "Optical Constants and Associated Functions of Metastable Diamondlike Amorphous Carbon Films in the Energy Range 0.5–7.3 eV," *J. Appl. Phys.,* 59(12):4133–4145, 15 Jun. 1986.

Collins, C. B., et al., "Plasma Source of Amorphic Diamond," *Appl. Phys. Lett.,* 54(3):216–218 (Jan. 16, 1989).

Wagal, S. S., et al., "Diamond–Like Carbon Films Prepared with a Laser Ion Source," *Appl. Phys. Lett.,* 53(3):187–188 (Jul. 18, 1988).

Davanloo, et al., "Amorphic Diamond Films Produced by a Laser Plasma Source," *J. Appl. Phys.* 67(4):2081–2087, Feb. 15, 1990.

F. Davanloo, et al., "Mechanical and Adhesion Properties of Amorphic Diamond Films," *Thin Solid Films* vol. 212, pp. 216–219 (May 15, 1992).

Collins, et al., "The Bonding of Protective Films of Amorphic Diamond to Titanium," *J. Appl. Phys.* vol. 71, pp. 3260–3265 (Apr. 1, 1992).

0.2 μm

NANOPHASE DIAMOND FILMS

This is a division application of Ser. No. 08/042,104 filed Apr. 1, 1993 now U.S. Pat. No. 5,411,797, which is a continuation-in-part of Ser. No. 602,155 filed Oct. 22, 1990, which is a continuation-in-part of Ser. No. 521,694, filed May 9, 1990 (now U.S. Pat. No. 5,098,737), which is a continuation-in-part of Ser. No. 264,224, filed Oct. 28, 1988 (abandoned), which was a continuation-in-part of Ser. No. 183,022, filed Apr. 18, 1988 (now U.S. Pat. No. 4,987,007). This is also a continuation-in-part of Ser. No. 821,642, filed Jan. 16, 1992, which is a divisional of Ser. No. 521,694, filed May 9, 1990 (now U.S. Pat. No. 5,098,737).

BACKGROUND OF THE INVENTION

This invention relates to an amorphous or ultra fine-grained, diamond-like material that is substantially free of graphite and hydrogen, and is deposited in a film on a substrate in the form of nanometer-sized, tightly packed nodules of $sp^3$-bonded carbon, hereinafter referred to as "nanophase diamond." In one method of preparing the material of the present invention, a laser beam is directed onto the substrate before and/or during deposition of diamond-like particles on the substrate to substantially eliminate graphite particles thereon. Laser energy focused on the substrate is helpful for preventing substantial build-up of graphite. Furthermore, laser energy on the substrate is also useful for preconditioning the substrate to facilitate bonding of diamond-like particles to the substrate.

In recent years, there has been great interest in producing a diamond-like carbon coating for a variety of reasons. First, diamond-like carbon has an extremely hard surface nearly impervious to physical abuse (abrasive or chemical) and is therefore quite useful as a protective surface. Diamond-like carbon is optically transparent (in, e.g., the infrared spectrum), and is therefore believed to be useful in a variety of optics applications such as protecting sensor optical circuits, quantum wells, etc. In addition, diamond-like carbon has been found to have a high electrical resistivity as well as high thermal conductivity—an unusual combination. Diamond-like carbon, when doped, can act as a semiconductor, thereby forming the basis of technology for microcircuitry that can operate under hostile conditions of high temperatures and high radiation levels. Therefore, great interest has been shown in developing techniques for obtaining diamond-like carbon films in commercial quantities for possible use in the semiconductor industry.

While natural diamond is a generally well defined substance, so-called "diamond-like carbon" films are not well defined, possibly because of the many different methods of preparation which contribute unique aspects to the product. From a structural viewpoint, six allotropes of carbon have been identified—two for each of the numbers of dimensions through which the carbon atoms may bond. The two most important carbon allotropes of interest in the optics and semiconductor industries are the two dimensional $sp^2$ bonding characteristic of graphite, and the three dimensional $sp^3$ tetrahedral bonding which gives natural diamond its unique properties. The article *Low Pressure, Metastable Growth of Diamond and Diamondlike Phases*, by John C. Angus and Cliff C. Hayman, 41 Science pp. 1913–21 (August 1988), describes different types of diamond-like phases, methods of production, and possible uses, the disclosure of which is expressly incorporated herein by reference.

Natural diamond has the highest hardness and elastic modulus of any natural material. Diamond is the least compressible natural substance known, has the highest thermal conductivity, and also has a low thermal expansion coefficient. Further, diamond is a wide band gap semiconductor, having a high breakdown voltage ($10^7$V/cm) in a saturation velocity ($2.7 \times 10^7$ cm/s) greater than silicon, gallium arsenide, or indium phosphide. Thus, diamond-like carbon films are potentially useful in the electronics industry as a protective, resistive coating with extremely desirable heat sink properties.

Several different kinds of thin films having some of the properties of diamond can be made from pure carbon. Preferably prepared entirely without hydrogen, fluorine or any other catalysts, these materials can be distinguished by their internal structures. Three forms have been reported: (1) defected graphite, (2) i-C, and (3) "amorphic" diamond. See Collins et al., "The Bonding of Protective Films of Amorphic Diamond to Titanium," 71 *J. App. Phys.* 3260 (1992), the disclosure of which is herein incorporated by reference. The term "amorphic" derives from a combination of the terms "amorphous" and "ceramic," and has become a term of art to describe a material comprising amorphous carbon having diamond-like properties. In the first type of carbon-based material, diamond-like properties seem to accrue from a high density of defects in otherwise orderly graphite that trap electrons and shorten bonds to increase both strength and transparency. The other two materials, i-C and "amorphic" diamond, derive their enhanced characteristics from an abundance of carbon atoms linked by the $sp^3$ bonds of diamond.

Currently, four major methods are being investigated for producing so-called "diamond-like" carbon films: (1) ion beam deposition; (2) chemical vapor deposition; (3) plasma enhanced chemical vapor depositions; and (4) sputter deposition.

The ion beam deposition method typically involves producing carbon ions by heating a filament and accelerating carbon ions to selected energies for deposit on a substrate in a high vacuum environment. Ion beam systems use differential pumping and mass separation techniques to reduce the level of impurities in the carbon ion fluence to the growing film. While films of diamond-like carbon having desirable properties can be obtained with such ion beam techniques, the films are expensive to produce and are achievable only at very slow rates of growth on the order of 50 angstroms per day to perhaps as high as a few hundred angstroms per day.

The chemical vapor deposition and plasma enhanced chemical vapor deposition methods are similar in operation and have associated problems. Both methods use the dissociation of organic vapors (such as $CH_3OH$, $C_2H_2$, and $CH_3OHCH_3$) to produce both carbon ions and neutral atoms of carbon for deposit on a substrate. Unfortunately, the collateral products of dissociation frequently contaminate the growing film. While both chemical vapor deposition and plasma enhanced chemical vapor deposition achieve film growth rates of practical levels, such films are of poor optical quality and unsuitable for most commercial uses. For example, if the films are amorphous, the internal stress is too high to permit growth to useful thickness; if crystalline, there is no bonding to the substrate. Further, epitaxial growth is simply not possible using chemical vapor deposition techniques.

Sputtering deposition usually includes two ion sources, one for sputtering carbon from a graphite source onto a substrate, and another ion source for breaking the unwanted graphite bonds in the growing film. In the typical sputtering method, an argon ion sputtering gun sputters pure carbon atoms off of a graphite target within a vacuum chamber, and the carbon atoms are condensed onto a substrate. Simultaneously, another argon ion source bombards the substrate to enhance the breakdown of the graphite bonding in favor of a diamond-like $sp^3$ tetrahedral bond in the growing carbon film. The poor vacuum and relatively high pressure ($10^{-5}$ to $10^{-4}$ torr) in sputtering deposition is cumbersome and tends to introduce contamination of the film on a level comparable to those encountered in chemical vapor deposition and plasma enhanced chemical vapor deposition.

Therefore, while many attempts have been made to obtain high quality diamond-like carbon at commercial levels of production, the results have thus far been disappointing. The known methods recited above are deficient in many respects. While the ion beam deposition method produces a good quality film, its slow growth rates are impractical. The chemical vapor deposition and sputter methods are prone to contamination, yielding an unacceptable film in most circumstances. Additionally, the chemical vapor deposition technique creates a growth environment that is too hostile for fragile substrates. Indeed, the aggressive chemical environment characteristic of chemical vapor deposition could result in destruction of the very substrate that the diamond-like film is intended to protect. Moreover, all known methods require elevated temperatures, which often prove impractical if coating an optical substrate is desired. The known methods also involve complex and cumbersome devices to implement.

Chemical vapor deposition techniques have been useful in obtaining diamond-like carbon material denoted "a-C:H," which is an amorphic carbon structure containing a significant amount of hydrogen. In fact, it is believed that hydrogen is necessary for permitting realistic growth of the metastable diamond-like material and that a reduction in the amount of hydrogen below about 20% degrades the film towards graphite. Of course the amount of hydrogen correlates with the proportions of $sp^3$ to $sp^2$ bonding and the correlation of diamond-like properties to graphite-like properties.

It appears that some ion-sputter techniques have been successful in producing a diamond-like carbon material without hydrogen—so-called "a-C" film. (See, *Low Pressure, Metastable Growth of Diamond and Diamondlike Phases,* page 920, supra). Such a-C diamond-like carbon is interesting in that the ratio of $sp^3$ to $sp^2$ bonding is believed to be high, with a corresponding increase in diamond-like properties. Unfortunately, the growth rates of such a-C materials are extremely slow and not commercially viable. In addition, internal stresses are too high to permit growth to useful thicknesses. Further, ion energies are too low to permit bonding with the substrates. Apparently, attempts to increase growth rates using increased power densities in such ion sputter techniques resulted in a decrease in the ratio of $sp^3$ to $sp^2$ bonding.

Producing diamond-like carbon is just one example of the general problem of producing a layer of material having desirable physical properties where the material is extremely difficult to handle or manipulate. Examples of other such materials include semiconductors, such as silicon, germanium, gallium arsenide, and recently discovered superconducting materials which might be generally characterized as difficult to handle ceramics (e.g., yttrium-barium compounds). Therefore, it would be a significant advance to achieve a method and apparatus which could produce an optical quality diamond-like layer having an abundance of $sp^3$ bonding (and therefore diamond-like qualities) in commercial quantities. Further, it would be significant if such method and apparatus were useful in producing layers of other types of materials which, using conventional technology, are difficult to handle or produce.

SUMMARY OF THE INVENTION

The present invention represents a nanophase diamond film which has extremely desirable properties such as physical hardness, electrical strength, high thermal conductivity, and optical transparency. An exemplary method and apparatus for preparing a nanophase diamond film are also disclosed herein. The following patents also disclose apparatus and methods suitable for producing nanophase diamond, the disclosures of which are herein incorporated by reference: U.S. Pat. No. 4,987,007 to Wagel et al., issued Jan. 22, 1991; and U.S. Pat. No. 5,098,737 to Collins et al., issued Mar. 24, 1992.

The basic unit of construction of the nanophase diamond of the present invention is the $sp^3$-bonded nodule. Typically, these nodules range in size from 100 to 1000 angstroms in diameter and contribute the properties of diamond found in the finished films. The nodules lack coherent ordering, probably because they contain a random alternation of the cubic and hexagonal polytypes of diamond. With electron diffraction, they appear amorphous. Moreover, the nanophase diamond films of the present invention lack the internal ordering necessary to display the Raman line of diamond. However, estimates supported by measurements of mass densities and soft x-ray ($K\alpha$) emission spectra suggest that the $sp^2$ content within the nodules is less than 5% and perhaps even as low as 2%, indicating a "diamond-like" material. Between the nodules is found an amorphous mixture of carbons and void.

Nanophase diamond is perhaps a limiting form of i-C. Both materials are comprised of diamond nodules, but only in nanophase diamond have the nodules been reported to be densely packed throughout the volume of the film. The typical appearance of a nanophase diamond film as shown by transmission electron microscopy (TEM) is seen in FIG. 6.

While the real parts of the indices of refraction of the nanophase diamond film of the present invention are interesting in that they approach the value of natural diamond (2.42), the greatest diagnostic significance lies in the imaginary parts of the indices of refraction (lossy part) Measurement of these optical qualities is particularly useful at the wavelength of the Helium-Neon laser, or 632.8 nm. It is believed that a small value (less than 1.0) of the imaginary part of the indices of refraction is attributable to the fraction of $sp^2$ bonding within the nanophase diamond film (provided the real part is reasonably constant). Natural diamond will approach an imaginary index of refraction of zero, indicating almost pure $sp^3$ bonding. Advantageously, the nanophase diamond films of the present invention have an imaginary index of refraction less than 1.0, and preferably less than 0.5, indicating a preponderance of $sp^3$ bonding. Indeed, the proportion of $sp^2$ bonding within the nanophase diamond films of the present invention has been found to be generally less than 25%, and as low as 2%, depending on the manufacturing process.

The optical quality of nanophase diamond layers hereof have been produced at high growth rates exceeding 0.5 microns per hour over large areas (e.g., 20 square centimeters) in thicknesses of about 5 nm to about 5000 nm. As high growth rates are maintained, a substantially graphite-free deposition of nanophase diamond material is achieved by providing a laser beam directly onto the deposition area (on the substrate), in addition to a laser beam on the graphite target and through the plume. The laser beam placed on the substrate reduces accumulation of undigested graphite material on the substrate. Furthermore, laser energy placed on the substrate helps facilitate bonding (preferably $sp^3$ bonding) of deposited nanometer-scale particles, forming nanophase diamond nodules on the substrate.

The target includes a moving, hardened graphite foil fed past the point of laser ablation and accumulated on a take-up reel. The tight bonding of each carbon atom into planar hexagonal nets in this type of graphite foil reduces the ejection of macroscopic particles (i.e., particles having dimensions greater than 1 micron or dimensions greater than the wavelengths of light being used in the particular optical application), and thereby prevents uneven deposition. Moreover, high growth rates are achieved by trailing electrons inherently attracted to the ions as the ions are placed upon the substrate. Not only do the trailing electrons improve growth rate, they also may collide with the ions to increase the energy of the ion path.

An electrode can be incorporated within the laser beam path to accelerate ions and trailing electrons away from the graphite foil target and toward the substrate. In addition, the electrode provides deceleration of the ions and trailing electrons at a point just before the ions and electrons are deposited upon the substrate. Acceleration and deceleration are achieved by electrical fields between the target and an electrode and between the electrode and substrate, respectively. Furthermore, a secondary electrode can be placed within the ion path and charged relative to the substrate so that the particles can be selectively placed at specific locations upon the substrate. Selective placement of particles provides in situ etching of the substrate during the deposition of the early layers of particles, increasing the strength of the bond of the nanophase diamond film with the substrate.

Broadly speaking, an apparatus for producing nanophase diamond films in accordance with the present invention includes a laser means directed within a vacuum chamber to impinge upon a continuous sheet of moving target material made of graphite foil placed within the chamber. The laser beam is focused upon the target material to ablate and eject a plume of carbon vapor whereby the plume is partially ionized by the laser beam. Ionization energies are achieved by focusing the laser beam upon the target material with sufficient energy, preferably greater than $1\times10^{10}$ W/cm$^2$, to both ablate and ionize carbon ions. A substrate is disposed within the chamber, to collect the ions and trailing electrons and to produce a layer of dehydrogenated nanophase diamond nodules upon the surface of the substrate.

For producing a nanophase diamond film substantially void of ejected graphite particles, it is important to (1) control the target material and/or (2) control the substrate conditions. First, by using an essentially pure graphite target arranged in a hardened foil configuration, ablation and ejection of macroscopic graphite particles toward the substrate are minimized. Second, by focusing a laser beam onto the substrate surface, graphite particles which happen to somehow make it onto the substrate are evaporated by the laser beam energy. The laser beam placed on the substrate can be obtained by reflecting a portion of the ionizing laser beam or by directing another laser beam source, independent of the ionizing laser beam source, onto the substrate.

Given sufficient power density upon the graphite foil target, optical quality nanophase diamond films described herein can be produced. Preferably, the laser beam traverses the ejected plume to enhance the plume temperature. In a preferred configuration, a primary electrode is positioned within the laser beam path to discharge through the plume to further increase the plume temperature by Joule heating. Furthermore, a secondary electrode is charged relative to the substrate to accelerate and then decelerate ions and trailing electrons in their path from the target toward the substrate. As the ions and electrons approach the substrate, they can then be directed and placed at specific locations upon the substrate.

A method of producing a film of nanophase diamond material in accordance with the present invention broadly comprises the steps of positioning a moving sheet of hardened graphite foil in a vacuum chamber, evacuating the chamber and directing a laser beam at an angle upon the graphite foil to obtain a plume of carbon substantially void of macroscopic particles having dimensions generally greater than 1 micron. The method further involves the steps of positioning a substrate in the chamber and positioning an electrical field disposed within the path of the laser beam between the substrate and the target, and then collecting a portion of the plume at selective points upon the substrate in accordance with the electrical field at a deposition rate greater than 0.1 microns per hour, and more typically about 0.5 microns per hour. The nanophase diamond material is substantially void of hydrogen and approaches the levels of hydrogen found in dehydrogenated natural diamond. Therefore, an advantage of the present invention is its ability to produce nanophase diamond layers having less than about 20% hydrogen (and preferably less than about 2% hydrogen) uniformly deposited across a substrate and substantially void of macroscopic particles.

In the present application, the term "layer" has generally been used synonymously with coating or film, and connotes material deposited or grown on a substrate. The layer may include an interfacial layer in which the nanophase diamond film is chemically bonded to the substrate. Also, it should be understood that the substrate is not necessarily a different material than the layer, but merely serves as a collection source for material. Thus, the substrate might comprise diamond or nanophase diamond on which a layer of nanophase diamond is received to produce a homogeneous part of uniform physical properties. Furthermore, it is understood that the nanophase diamond film comprises substantially dehydrogenated nodules of $sp^3$-bonded carbon (i.e., fine-grained clusters having dimensions of 100–1000 angstroms and preferably less than 500 angstroms).

In the present application "nanophase diamond" has been used as a generic term for a material having some of the physical characteristics of diamond. In view of the physical properties of the materials produced in accordance with the present invention, the layer might alternatively be called diamond or "amorphic" diamond. The term nanophase diamond generally may include nodules of diamond-bonded carbon containing anywhere from zero to 20% hydrogen concentration (although the nanophase diamond of the present invention is generally dehydrogenated at less than 5%). In addition, the films contain only insignificant amounts (preferably less than about 25%) of graphite ($sp^2$-bonded carbon) in the voids between the nodules. Thus, it is understood that the form of the material or the use of the term "nanophase diamond" indicates more than a specific type of composition (e.g., such as percentage of hydrogen or other impurities in interstitial sites in grain boundaries). The term "nanophase diamond" refers to any type of structure having nanometer-scale nodules of diamond-bonded carbon displaying characteristics similar to that of diamond.

DETAILED DESCRIPTION

Figure 1:
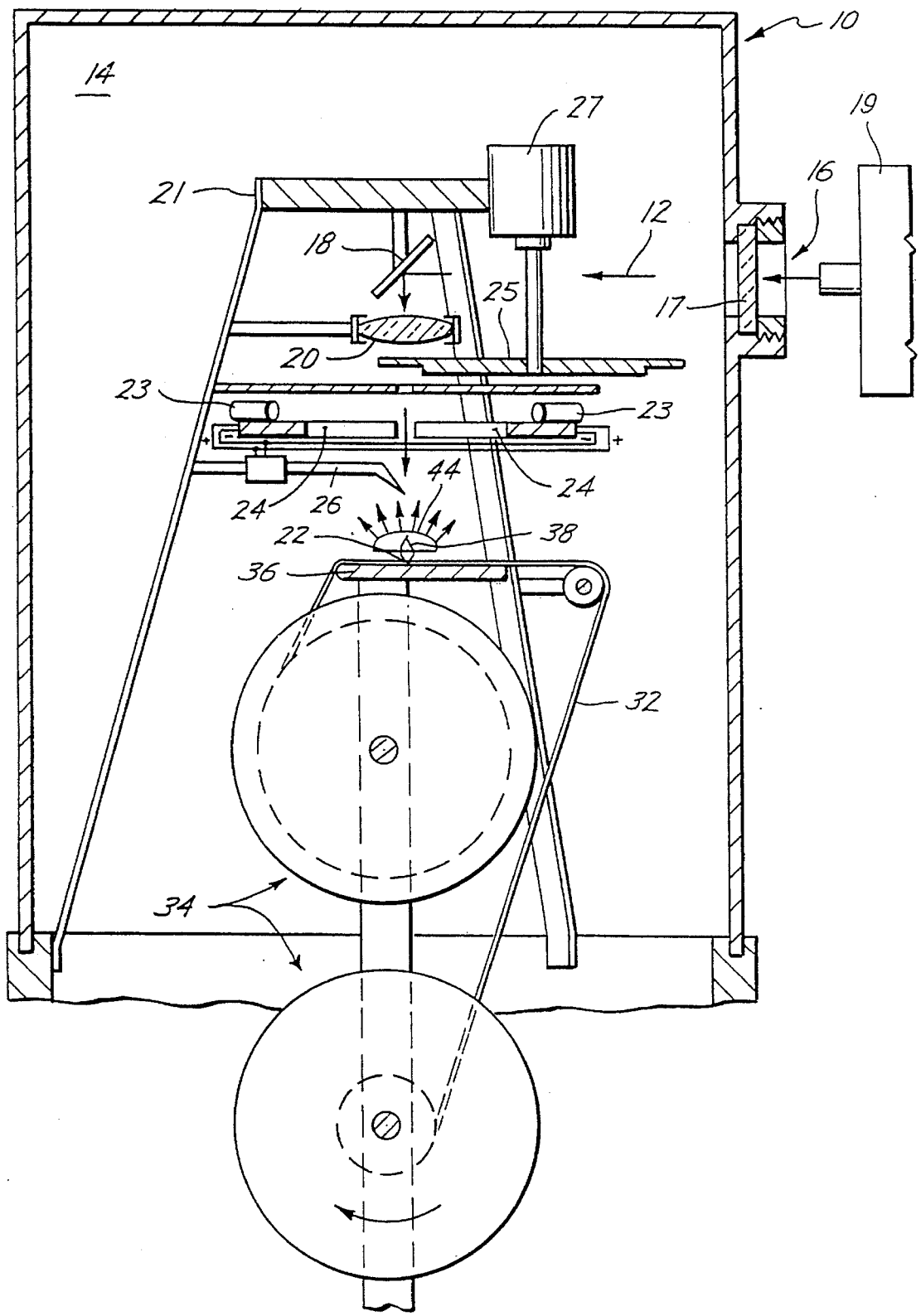
FIG. 1 is a schematic, fragmentary, sectional view of apparatus for producing nanophase diamond in accordance with the present invention.

Turning to the drawings, an apparatus for producing nanophase diamond in accordance with the present invention is illustrated. Broadly speaking, apparatus 10 shown in FIGS. 1 and 2 includes laser beam 12 which enters sealed chamber 14 via one or more windows 16. Windows 16 include a glass seal 17, which permits beam 12 to pass from laser source 19 into chamber 14. Glass seal 17 also prevents loss of evacuation in chamber 14. Reflecting mirror 18 disposed within chamber 14 is used to reflect incoming beam 12 toward focusing lens 20. Both lens 20 and mirror 18 are securely held in position by stationary structure 21 positioned within chamber 14. Lens 20 functions to focus beam 12 onto target 22. Substrate 24 is situated within chamber 14 to collect a layer of material produced by apparatus 10.

Figure 2:
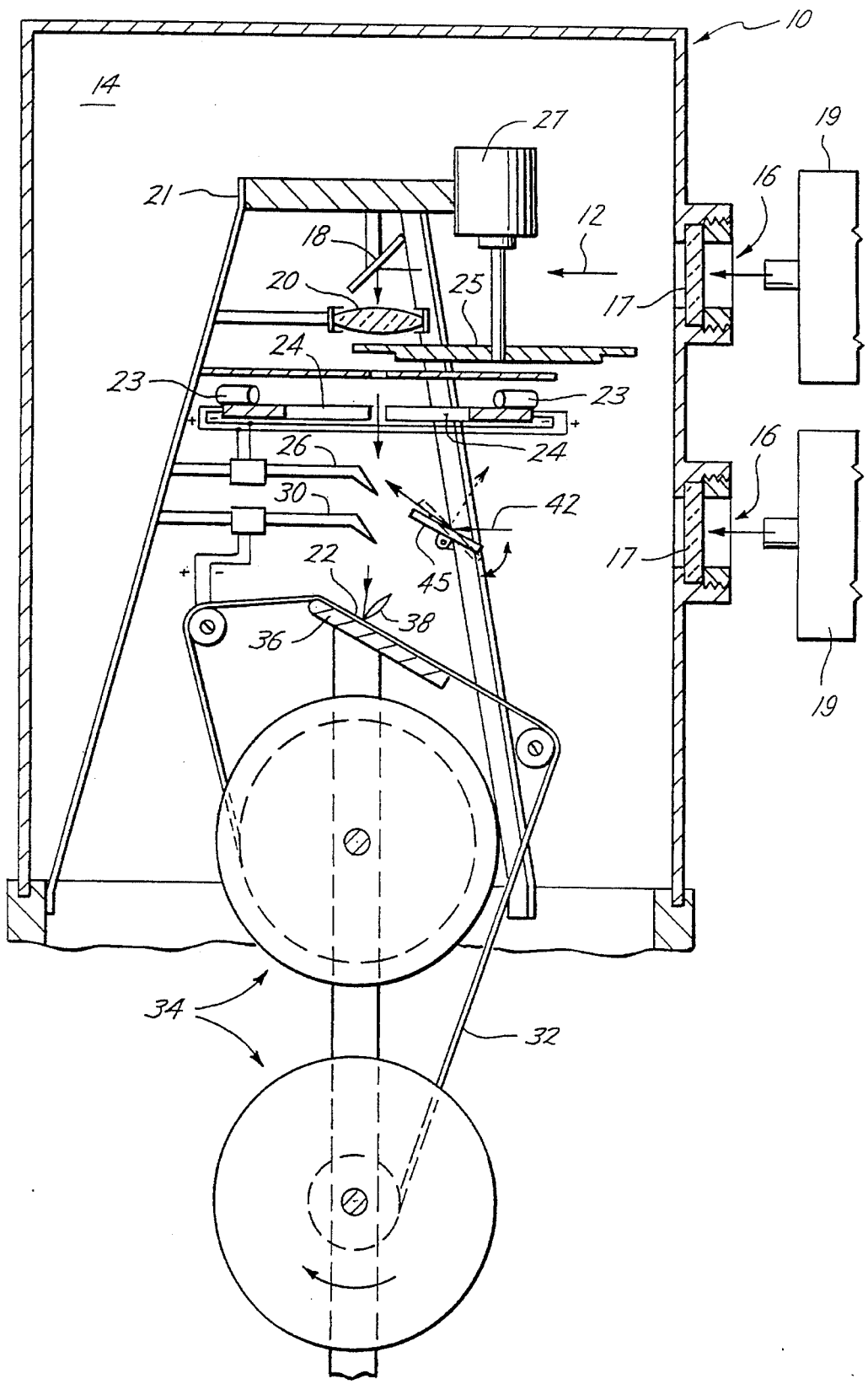
FIG. 2 is a schematic, fragmentary, sectional view of an alternative apparatus for producing nanophase diamond in accordance with the present invention.

In the illustrated embodiments shown in FIGS. 1 and 2, laser source 19 is preferably a Nd-Yag laser configured to deliver anywhere from 250 to 1000 millijoules in a Q-switch mode at the focus point with a repetition rate of 10 Hz. A Molectron MY34-10 laser has been satisfactorily used. The present invention postulates that the power density delivered to target 22 is an important parameter in obtaining the best layer of material. It is believed that focusing lens 20 is an important ingredient in achieving the desired power density output of laser beam 12.

Chamber 14 includes a cylindrical shell of sufficient rigidity to withstand vacuum forces when chamber 14 is evacuated to about $1 \times 10^{-6}$ Torr. It is noted that reflecting mirror 18, focusing mechanism 20, substrate 24, target 22, etc. are all rigidly secured within chamber 14 via structure 21.

Reflecting mirror 18 includes a highly reflective, smooth surface for redirecting the path of travel of laser beam 12 in chamber 14. The illustrated mirror is preferably a 45° reflector, Part No. Y1-15-45 made by CVI Laser Corporation of Albuquerque, N. Mex. Focusing lens 20 includes a lens which receives the directed laser beam and focuses the beam to a focal point on target 22. The illustrated lens is a plano-convex lens, Part No. PLCX-25.4/38.6 made by CVI Laser Corporation. The spot size of the arrangement illustrated in FIG. 2 is believed to be on the order of 75 microns.

However, it is believed desirable to use further optical improvements to achieve a smaller spot size, which of course would significantly enhance the power density of the energy delivered to target 22.

A shield mechanism 25 may be provided within the beam path and between lens 20 and substrate 24 to shield or reduce the contamination of mirror 18 and lens 20 from particles. Shield 25 may be rotatably coupled to motor 27 to provide a continuous fresh supply of shield material to the laser beam path.

Connected to each substrate 24 is a rotating means 23, or motor which rotates substrate 24 so that growth of nanophase diamond is placed uniformly over the surface of substrate 24.

An important aspect of the present apparatus is secondary discharge electrode 26 configured within the beam path and below substrate 24. Electrode 26 maintains a predetermined charge relative to substrate 24, wherein charged electrode 26 functions to form an electrical field between electrode 26 and substrate 24. The field is used to selectively place ions and trailing electrons upon the bottom surface of substrate 24 in accordance with the field. Thus, the present invention provides an electrical discharge between electrode 26 and substrate 24 in order to provide in situ etching of the substrate during the deposition of the early layers of particles. Nanophase diamond layers are selectively grown upon substrate 24 depending upon the magnitude and direction of field. Substrate 24 can be a uniform wafer of silicon (100). However, it will be understood that a selection of the substrate material is dependent upon the type of bonding desired with the film to be deposited. For example, it is believed that a substrate of Ni (110) permits a degree of epitaxial growth. Furthermore, substrate starting materials can be nanophase diamond material whereby diamond-like deposition will provide a homogeneous material. Still further, substrate starting material may thereby include materials such as Si, Ge, ZnS, Cu, stainless steel, quartz, glass and plastic. On the above substrate materials, films have been grown to a thickness of 5 microns at rates of 0.5 microns per hour over 100 cm² areas.

As illustrated in FIG. 1, substrate 24 may be rotated about a central axis arranged parallel with reflected beam 12. As previously mentioned, a rotary means 23 may be provided to enable rotating uniform deposition of particles upon the underneath side of substrate 24. A thin layer of particles are placed upon the substrate during each revolution such that numerous revolutions provide optical quality, uniform growth of nanophase diamond material.

Disposed below substrate 24 and electrode 26 is primary discharge electrode 30 shown in FIG. 2. As can be seen in FIG. 2, the distal tip of electrode 30 is disposed proximate to the laser beam path of travel to discharge approximately coincidentally with the laser beam path of travel to target 22. Electrode 30 is charged and thereby functions to draw ions and free trailing electrons from target 22 toward substrate 24. As the ions and electrons are withdrawn, they are accelerated within the laser beam path to increase the energy thereof necessary for placement upon the substrate 24 in nanophase diamond form. It is important to note that because electrode 30 is disposed between target 22 and substrate 24, ions and trailing free electrons are accelerated and heated as they are withdrawn from target 22 and are decelerated as they approach substrate 24. Deceleration enables gentle accumulation of nanophase diamond material upon the surface layer of substrate 24. Current flowing between secondary electrode 26 and substrate 24 continuously cleans the substrate and film as it grows.

As shown in both FIGS. 1 and 2, primary electrode 30 and secondary electrodes 26, can be of either positive or negative polarity relative to target 38 or substrate 24, respectfully. A switch (not shown) may be used to place either a positive or negative polarity charge upon either electrode. It should be noted that the presence of an electric field, and not solely the polarity of that electric field, is an important aspect of the apparatus shown. The polarity in either case can be selected to provide optimal growth at selected points upon the substrate 24 without accumulating undesirable macroscopic particles at those points.

In the illustrated embodiment of FIG. 2, target 22 is preferably a tape of graphite foil containing hardened pure graphite as might be obtained from Union Carbide UCAR Carbon Company of Cleveland, Ohio, GTA Premium GRAFOIL. Graphite foil, such as found in pyrolyric graphite foil, shows significant resistance to fragmentation and is of sufficient hardness to prevent ejection of macroscopic particles from the target during ablation and ionization. Thus, the hardened graphic foil prevents substantial amounts of large macroscopic particles, which exceed 1 micron in dimension, from being ejected during ablation. The tape of graphite foil 32 is continuous and is moving in accordance with rotating take-up reels 34. By moving graphite foil 32 during ablation, fresh target material is presented to the laser beam. Prolonged ablation of the same target location causes cratering in the material and a reduction in power density. Take-up reels 34 and holder assembly 36 are preferably made of graphite similar to the composition of the graphite foil 32. Graphite holder assembly 36 confines and directs the movement of graphite foil 32 through ablation point in a smooth fashion, while the graphite take-up reels 34 provide the constant linear speed of foil 32 through the holder. Continuous movement of foil 32 provides fresh target material in a constant power density at plume location 38. A heater (not shown) may be disposed adjacent one side of moving foil 32 to provide outgasing and other conditioning of the graphite foil. Conditioning of foil 32 prior to ablation helps maintain structural integrity of the foil and reduces ejection of macroscopic particles during ablation. Conditioning generally refers to the process of gently evaporating, 1) adsorbed, 2) absorbed, and 3) bonded impurities such as water vapor which would otherwise superheat and explode fragments of graphite during laser ablation.

An important aspect of the apparatus shown is the angle at which laser beam 12 strikes target 22. As shown in FIG. 2, the angle can be adjusted such that ablated macroscopic material can be ejected perpendicular to the surface of the target and thus at an angle away from substrate 24. As is commonly shown in conventional devices, the planar target is fixed perpendicular to the laser beam. In such a configuration, ejected macroscopic particles have a tendency to follow the laser beam path and electrical field directly back onto the substrate. By placing the longitudinal axis of target 22 at an angle, non-perpendicular to the laser beam path, substantial amounts of macroscopic particles can be ejected perpendicular to the surface of the target and thus away from the field and laser beam path. Thus, fewer macroscopic particles are placed upon the substrate when target 22 is disposed at an angle, non-perpendicular to the laser beam path 12. Even though angle adjustment provides a reduction in macroscopic deposition, non-macroscopic deposition rates remain fairly constant over broad adjustment angles. Fairly constant deposition rates of non-macroscopic particles are achieved independent of angle of adjustment since non-macroscopic particles (particles less than 1 micron in dimension) are postulated to be more susceptible to being guided toward substrate 24 than are larger macroscopic particles. Angle adjustment of target 22 is achieved by simply adjusting the angle of graphite holder assembly 36.

In use, chamber 14 is evacuated to about $1 \times 10^{-6}$ Torr and laser beam 12 is shown in FIG. 1 as entering chamber 14 through window 16. Laser beam 12 is preferably generated from a Nd-Yag laser which preferably delivers approximately 250–1000 millijoules at a repetition rate of 10 Hz in about 15 nanosecond pulses. Beam 12 is focused by focusing lens 20 such that it produces about $5 \times 10^{11}$ watts per square centimeter on target 22. When pulsed, laser beam 12 impinges upon target 22 and ejects a plume 38 containing carbon ions and small amounts of trailing electrons from the surface of target 22 approximately perpendicular to the surface of target 22. That is, plume 38 can be adjusted at various angles from the travel path of impinging beam 12. If holder assembly 36 is adjusted in a horizontal position, then plume 38 will be collinear with impinging beam 12. However, by arranging target 22 at an angle from horizontal, plume 38 will not be collinear with beam 12. A non-collinear arrangement will decrease the amount of macroscopic particles accelerated towards substrate 24. Non-collinear arrangement thereby provides extraction of substantial quantities of undesirable macroscopic particles in a direction away from substrate 24. As shown in FIG. 2, when holder assembly 36 is configured at an angle relative to horizontal position, plume 38 becomes non-collinear with impinging beam 12. The plume is schematically illustrated as about a 30° cone, but it should be understood that the density of material in the plume is more concentrated in a cone about several degrees in diameter.

An important aspect of the apparatus shown is that either a portion of beam 12 or a separate beam 42 can be focused upon the substrate 24 either before, during or after the deposition of plume thereof. By illuminating the area of growth with laser radiation, graphitic bonding is destroyed and graphite particles are evaporated. Thus, placing of laser energy upon substrate 24 preferentially attacks and removes any condensation of unwanted graphite placed on the growing film. By using a partially silvered mirror 44, portions of laser beam 12 are reflected from the surface of mirror 44 and impinge upon the growing surface of substrate 24. FIG. 1 illustrates mirror 44, and partially reflected laser beam 12. As an alternative to using mirror 44, a separate laser beam 42 and reflecting mirror 45, as shown in FIG. 2, can be used to provide laser energy on the growing substrate surface. Laser beam 42 is generated from a separate laser source 19 as shown. Either the embodiment shown in FIG. 1 or the embodiment shown in FIG. 2 provides sufficient energy upon the substrate to digest or evaporate feedstock graphite material placed upon substrate 24 from plume 38. Although, it is appreciated that the hardened graphite material of the present invention substantially prevents macroscopic particles of graphite from being ejected toward substrate 24, focusing laser energy onto the growing surface of substrate 24 further enhances the quality of the resulting film by more completely eliminating graphite particles on the substrate. Thus, a combination of hardened graphite foil 32 (either placed horizontally or at an angle) and the focusing of laser energy upon the growing surface is one acceptable means for providing substantial elimination of graphitic material from the nanophase diamond material of the present invention.

Without being bound by theory, it is believed that total energy delivered to the plume of ejected target material is critical to the production of optical quality nanophase diamond in accordance with the present invention. For this reason, it is believed desirable to have laser beam 12 traverse at least a part of plume 38. Contrary to current belief, it is postulated that an increase in power density delivered to target material 22 yields a more desirable nanophase diamond material. Thus, it is believed that substitution of a laser mechanism capable of larger laser pulse energy would improve the quality—increase the proportion of sp$^3$ bonding—of the nanophase diamond produced, as well as possibly increasing deposition rate. Further, a focusing lens 20 with a smaller spot size is expected to increase the quality of the nanophase diamond material produced, because a tighter focus gives a higher temperature to a smaller amount of carbon material in the plume 38. However, it is expected that a tighter focus would give a smaller growth rate.

Electrode 30 has been found to provide a relatively inexpensive opportunity to further increase the power density in plume 38. As can be seen in FIG. 2, the disposition of the tip of electrode 30 is provided proximate to the laser beam path of travel, with the discharge desirably traversing the plume. Thus, with the laser beam ionizing carbon particles in the plume, the discharge of electrode 30 most readily occurs through the ionized plume. This auxiliary discharge further increases plume plasma temperature by Joule heating in the relatively small volume of the ablation plume.

While electrode 30 provides Joule heating of the plume, it also provides a guide for ions and trailing electrons to follow in their path from target 22 to substrate 24. As holder assembly 36 rotates at an angle about the horizontal, macroscopic particles eject generally perpendicular to target 22 whereas plume 38, containing ions and trailing electrons, tends to eject toward electrode 30 along the beam path of travel. Thus, electrical discharge of electrode 30 aids in drawing desirable non-macroscopic particles toward substrate 24. It is thereby postulated that plume angle of ejection is therefore between the perpendicular ejection angle of macroscopic particles and the laser beam path when holder 36 is at an angle as shown in FIG. 2. Further, electrode 26 operates to provide additional direction or guidance of ions and trailing electrons upon substrate 24. Charging electrode 26 will provide electrical discharge between electrode 26 and substrate 24. Discharge of electrode 26 will then place ions and trailing electrons upon substrate 24 at precise locations during the rotation of substrate by rotary system 23. Selective placement will effectually provide in situ etching of the substrate during the deposition of the early layers of particles.

Of major importance in the production of optical quality nanophase diamond films is the type of target or feedstock used in generating the carbon particles. The present invention utilizes a novel feedstock or target 22 which includes a tape of hardened graphite foil such as pyrolytic graphite. The advantages in using hardened graphite foil rather than conventional graphite, is that ejection of macroscopic materials is minimized. Also, a foil is advantageous in that it is resistant to fragmentation. A heater may be provided to provide thermal outgasing and general conditioning of the foil before the moving foil is struck by beam 12. Outgasing is a desired outcome for removing impurities such as water vapor prior to being received by beam 12.

Operation of apparatus 10 provides deposits of an optical quality nanophase diamond layer on substrate 24. The layer of nanophase diamond film may be grown at rates of about 0.5 microns per hour in a 100 square centimeter area. In FIG. 1, the substrate is about 5.5 centimeters from target 22 and the radial expansion of the ejected material in the plume produces a domed profile thickness on substrate 24. Thicknesses of the nanophase diamond films vary from about 5 nm to about 5000 nm.

Figure 6:
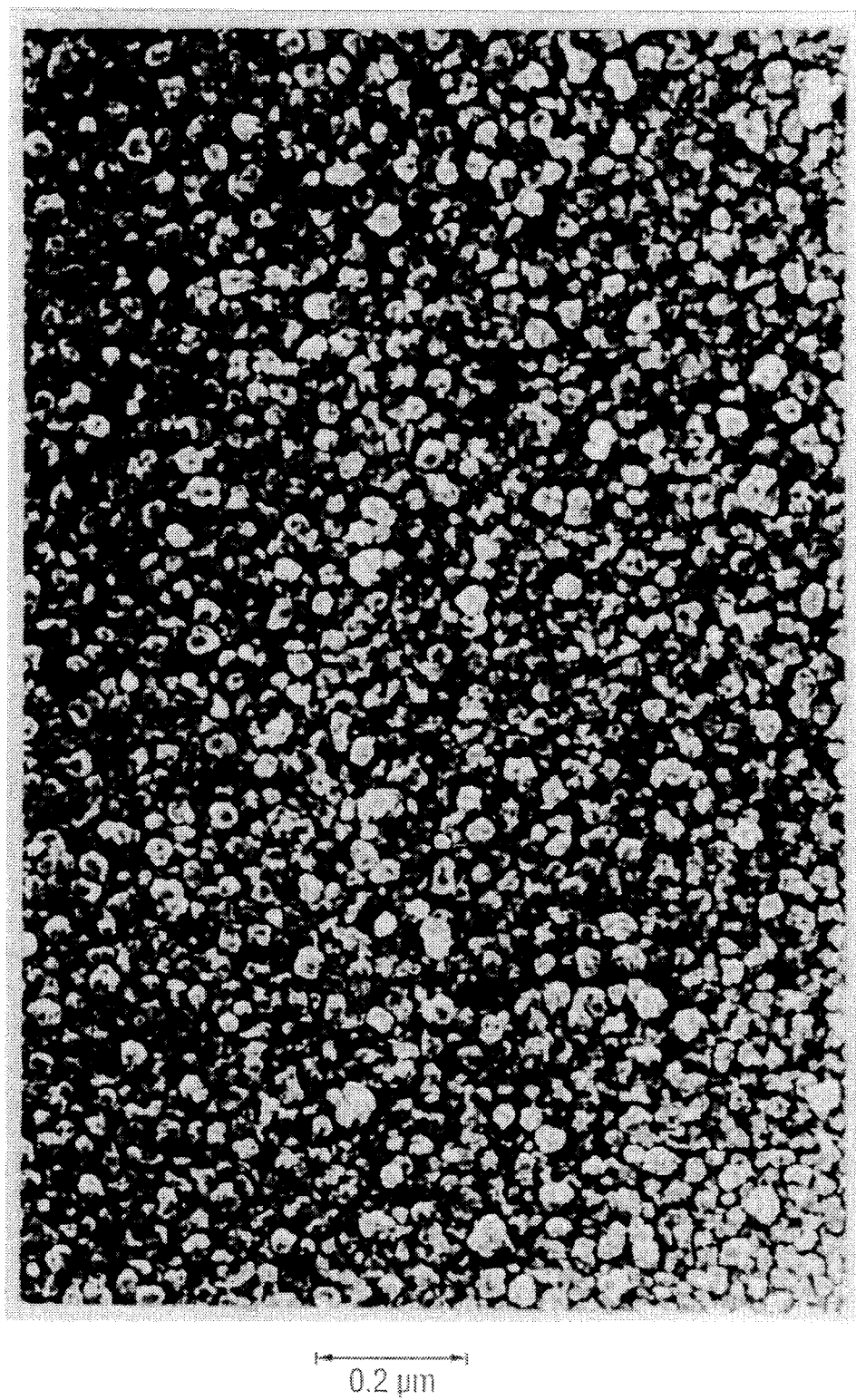
FIG. 6 is a photograph of diamond nodules shown by transmission electron microscopy of a gold-coated replica of a film of nanophase diamond in accordance with the present invention.

FIG. 6 shows the nodules of the nanophase diamond film as captured by transmission electron microscopy (TEM). As indicated in the photograph, the nodules typically have a diameter of 100–200 angstroms. The visual appearance of the film at the micron level is of tightly-packed, yet randomly ordered, diamond nodules.

The optical quality of the nanophase diamond layer is particularly significant in that it is capable of providing a visual appearance of Newton's rings of interference. The occurrence of Newton's rings in a film of optical material can be an especially useful means for distinguishing that material from other so-called optical quality, or "diamond-like" materials. Properties of importance to the quality of an optical material include quantities such as a high index of refraction, a low coefficient for absorption of light, a smooth surface finish, and a nodule or crystal size smaller than a wavelength of the light of interest. Each of these properties is a necessary but not sufficient condition to support the appearance of Newton's rings. Thus, while two samples might have the same indices of refraction, or might both be described as optically smooth, they may nevertheless be distinguishably different on the basis of other properties just listed. Therefore, the appearance of Newton's rings is a particularly effective test for the simultaneous occurrence of optimal values of all of the figures of merit for an optical material.

Particularly where so-called "diamond like" films are concerned, it cannot be assumed that the film may be made of sufficient thickness to sustain a visual appearance of Newton's rings. The film's absorption of light could be great enough that in films of sufficient thickness too much light would be absorbed, frustrating the constructive interference needed to produce the colors characteristic of Newton's rings.

For example, one so-called "diamond-like" carbon film is describes in Savvides, "Optical Constants and Associated Functions of Metastable Diamondlike Amorphous Carbon Films in the Energy Range 0.5–7.3 eV," 59 *J. Appl. Phys.* 12 (1986). Although the film is disclosed as having diamond-like qualities, the optical quality of the film is shown to vary markedly based on the film's thickness. For thicknesses greater than 500 nm (0.5 microns), the film is described as opaque and glossy black, rendering the existence of Newton's Rings impossible. See Savvides, page 4137. Even for thicknesses of up to 200 nm, the Sawides film is described as only "transparent," and grey to brown in color. In contrast, the nanophase diamond film of the present invention retains optical characteristics essential for producing Newton's rings even for thickness greater than 2 microns. Although the Newton's rings may not be readily visible in a nanophase diamond film of thicknesses greater than a few nanometers, the optical quality of the film can be confirmed by viewing cross-sections of the film, wherein Newton's rings will be visible.

Neither can it be assumed that if light absorption is low, then constructive interference is guaranteed. If the material contains grain boundaries larger than a wavelength of light or possesses internal scattering defects, it can disrupt the phase (coherence) of the light reflections so constructive interference cannot occur; no colors will thus appear. The best example of such a situation is ground glass, which is not black (and thus not light-absorptive), but contains internal light disruptions that prevent the formation of images and interference. Thus, just because a material has a few optical qualities (such as high index of refraction and low light absorption) does not indicate that it will necessarily display Newton's rings. To display Newton's rings, all optical properties must be optimized.

For example, the Savvides film mentioned above is described as having a defect microstructure including fibrous columnar growth and microstructural defects such as voids. See Savvides at p. 4136. Such columnar growth and voids are the sort of internal disruptions that would prevent the appearance of Newton's rings. The present nanophase diamond film, in contrast, has no long-range internal ordering of nodules, and thus no columnar growth that would disrupt the constructive interference essential to create Newton's rings.

Figure 3:
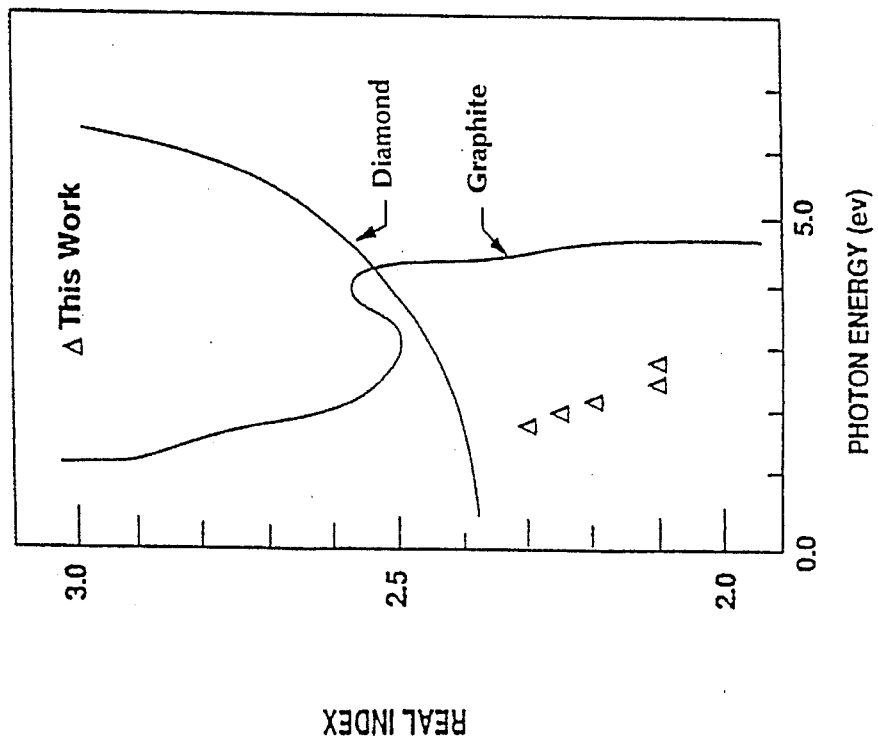
FIG. 3 is a plot showing real indices of refraction of various samples of nanophase diamond film produced in accordance with the present invention.

FIG. 3 is a plot of the real indices of refraction of various samples of nanophase diamond film produced in accordance with the present invention. FIG. 3 shows the experimental results versus expected values of natural diamond and graphite. The experimental results using apparatus 10 of the present invention approaches the value of 2.42 for natural diamond.

Figure 4:
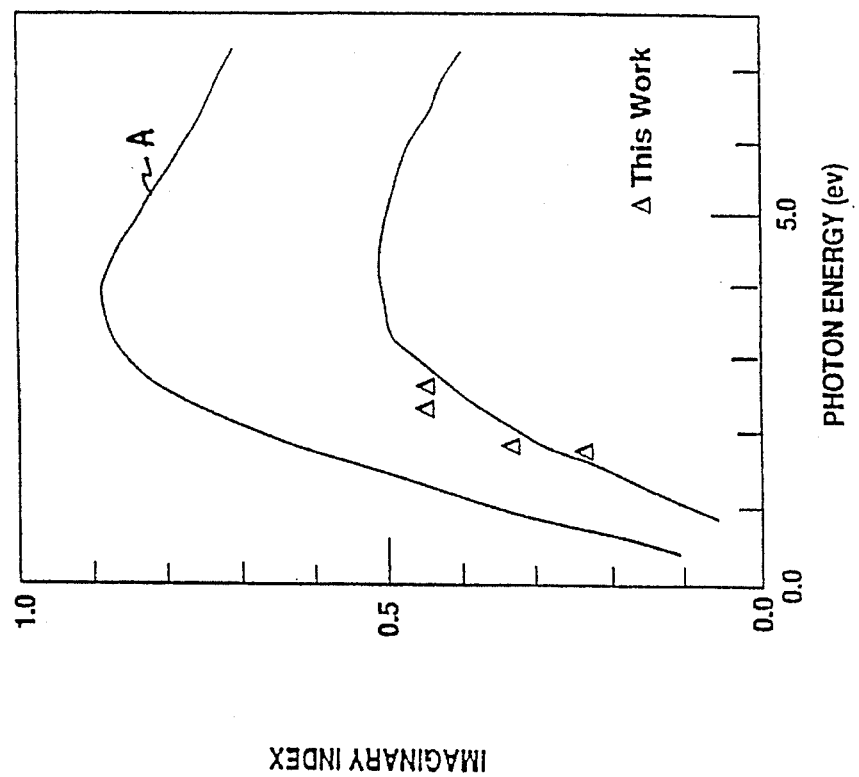
FIG. 4 is a plot showing imaginary indices of refraction of various samples of a nanophase diamond film produced in accordance with the present invention.

It is believed, however, that the greatest diagnostic significance lies in the imaginary parts (loss) of the indices of refraction as shown in FIG. 4. It is believed that at small indices (less than 1.0 for a light wavelength of 632.8) the imaginary parts of the indices of refraction are approximately proportional to the fraction of $sp^2$ bonding in the film, provided the real parts are reasonably constant. Purely diamond-like $sp^3$ bonding would give no loss at these photon energies. It is believed that the curve labeled A in FIG. 4 is identified with an approximately 25% content of graphitic, $sp^2$ bonds. See, N. Savvides, 58 *J. Appl. Phys.*, 518 (1985); 59 *J. Appl. Phys.*, 4133 (1986) (expressly incorporated herein by reference). The nanophase diamond films produced by the present invention are believed to have about 25% or less $sp^2$ bonding, as shown in FIG. 4. Contrary to current belief, it is postulated that residual $sp^2$ bonds are an artifact of production and are not necessary for stability of the remaining diamond-like $sp^3$ bonding. Therefore, it is believed that a dehydrogenated nanophase diamond film can be grown by the apparatus of the present invention in which the $sp^2$ bonding is minimal (on the order of 2% or less), resulting in characteristics approaching that of natural diamond.

Figure 5:
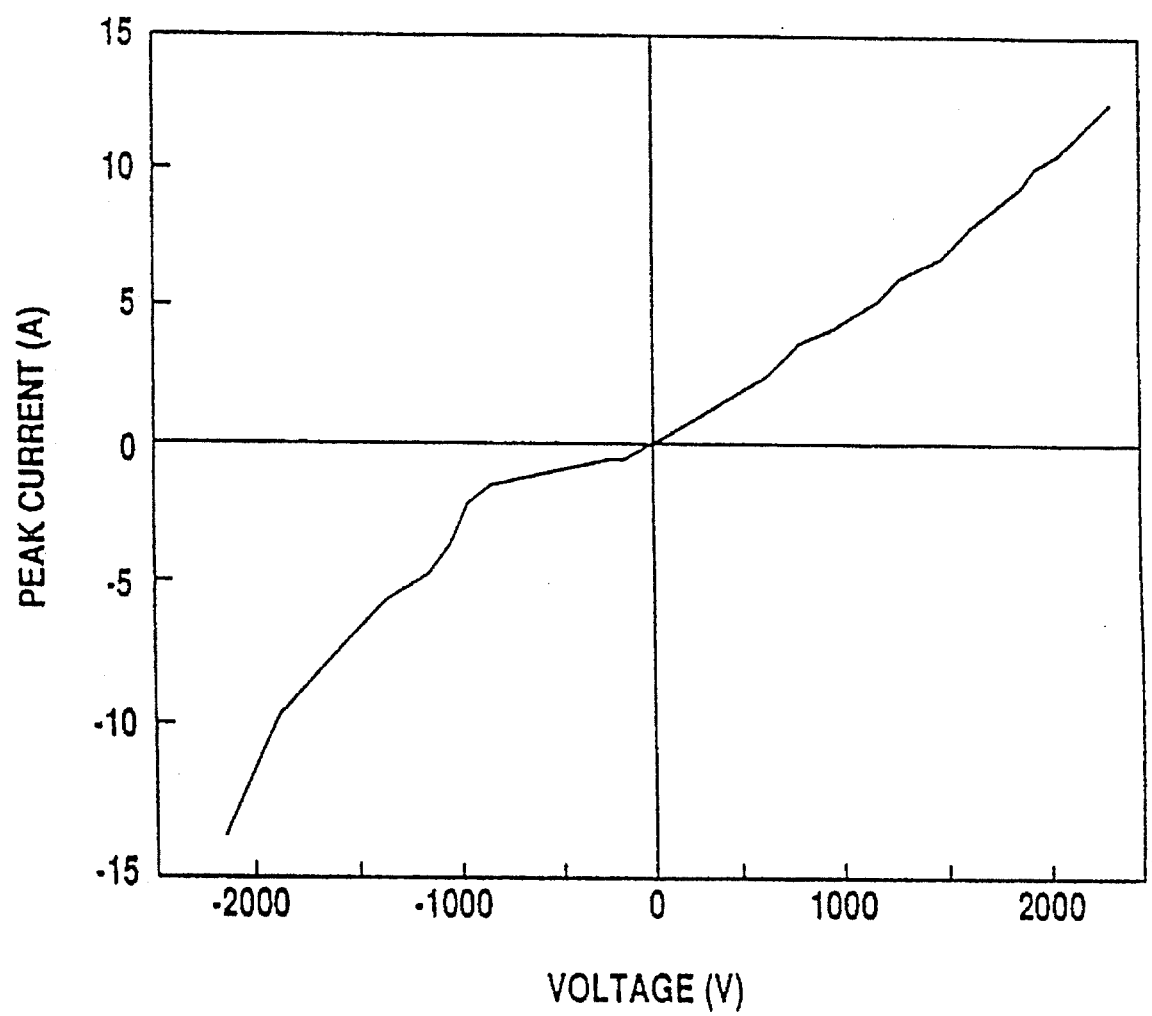
FIG. 5 is a plot showing experimental results of a coil placed along the laser beam path of an apparatus for producing nanophase diamond in accordance with the present invention.

Experimentally, a Rogowski coil was placed along the laser beam path of travel between the electrode 30 and target 22. FIG. 5 illustrates the experimental results. From the time dependency of the current, it appears that current flows only when material in the plume is filling the space between the electrode 30 and target 22, as would be expected.

The asymmetric voltage/current characteristics shown in FIG. 5 is typical of a gas-filled diode with a "forward" direction with the conduction shown in the first quadrant being established when the plume is negative—and thus is able to function as a hot filament. The selection of either positive or negative voltages gives the same absolute value of current and generally yields very similar depositions of the nanophase diamond film on the substrate 24.

Operation of apparatus 10 appears to be successful due to high laser intensity in the ablation plume and the discharge current from electrode 30. In addition, higher quality films are produced by aspects of the present invention, including: (1) the improved feedstock or target material 22, (2) electrode 26, (3) non-collinear arrangement of plume 38 and beam 12, and (4) elimination of graphitic material at the growing region on substrate 24. Improved target material comprising graphite foil arranged at various angles about the horizontal plane, provides a more uniform and higher quality nanophase diamond film upon substrate 24. Further, electrode 26 discharge provides in situ etching of the substrate during the deposition process. Still further, laser energy on the substrate provides a substantial reduction on graphitic impurities thereon.

Contrary to current belief, it is postulated that the ablated material in the plume must be travelling as a largely neutral plasma. That is, the carbon ions existing in the plume are believed to be transported currently with trailing electrons. Therefore, it is believed that ion beam sputtering techniques with very low growth rates (e.g., 500 angstroms per hour) are fundamentally limited in their ability to reach high power densities at high enough values of fluence to be practical. Further, the imaginary indices of refraction (losses) of the nanophase diamond film produced in accordance with the present invention indicates that $sp^2$ bonding can be further reduced by using a laser of higher power and a focusing mechanism or lens to produce a smaller spot size. Meanwhile, the improved target material can withstand laser beams of higher power and smaller spot size without producing large amounts of undesirable macroscopic particles upon substrate 24.

Nanophase diamond has been prepared with varying proportions of $sp^2$-bonded carbon between the nodules and with different efficiencies of packing them. The diamond character has been attested by the agreement of structural morphology, density, optical properties, $K\alpha$ line energies, minimal hydrogen content, and hardness. A range of properties has been found that seems to correlate with the packing density of the diamond nodules. The better the packing, the closer the mechanical properties approach those of crystalline diamond. Moreover, the diagnostics have agreed in assigning a composition of at least 75% diamond to the samples most easily produced with the laser plasma deposition system described herein.

Although diamond is well known to be the hardest natural substance, nanophase diamond films have been prepared that are harder than natural diamond. Depending on the quality (and thus the expense) of the manufacturing process, nanophase diamond films have a hardness range of 30 GPa to 125 GPa. Natural diamond has a hardness of about 80 GPa. At the lower end of the range, the quantity of graphite is as much as 50%. At the higher end, the nanophase diamond film is virtually graphite-free. Due to the nature of nanophase diamond films, however, they are not brittle even at exceptional hardnesses. The nodule structure provides flexibility; yet, the bonding between the nodules is very strong, characteristic of the strength that accrues from very small atomic structures (such as iron whiskers).

The nanophase diamond films of the present invention are characterized by a very low average internal stress, on the order of 1 GPa or less. This is due to the tight packing of the nodules.

The nanophase diamond films of the present invention are also characterized by a very low coefficient of friction. In contrast to the very rough surface developed by the CVD deposition of polycrystalline diamond, nanophase diamond films appear smooth. A coefficient of friction of about 0.1 has been experimentally observed in coatings on a titanium substrate.

Yet another unique characteristic of the nanophase films of the present invention is the fact that the Kα line energy of the carbon in the film approaches that of the carbon in natural diamond. A Kα line energy, which is measurable with an x-ray spectrometer, results when the x-ray spectrum of the carbon in the film is excited with a focused electron beam on the film. The carbon in natural diamond has a different characteristic Kα line energy than does the carbon in graphite. It has been found that, due to the high proportion of $sp^3$ bonding of the carbon within the film, the Kα line energy of the carbon in the film is closer to that of the carbon in natural diamond than it is to that of the carbon in graphite; in other words, the Kα line energy for the carbon in the nanophase diamond film of the present invention "approaches" that of the carbon in natural diamond. This is yet another indicator that the nanophase diamond film of the present invention is "diamond-like." Moreover, only one Kα line energy is measurable. This is contrary to what would be expected if the film were simply a combination of diamond and graphite particles, which would result in two Kα lines energies, each one corresponding to the carbon in each substance.

The effect of compressive stress in a film is to generate a force tending to "pop" it off the surface to which it is applied. To produce a successful coating, a greater opposing force must be developed to hold the film onto the substrate. A number of techniques might be considered, but one of the best is simply to chemically bond the coating to the material it covers in an interfacial layer. One means of accomplishing this is by using the apparatus and method disclosed herein. The keV energies carried by the carbon ions created by the laser plasma source encourage the formation of an interfacial layer of 100 to 200 angstroms in thickness in which the nanophase diamond film is chemically bonded to the substrate. This enables the superior mechanical strength of the diamond layer to be used to protect the underlying substrate. In the archetypical case, nanophase diamond coatings on metal have been shown to provide significant advantages in reducing both friction and wear.

The existence of a chemical bond to the substrate depends on the material selected for the substrate. In some cases, it may not be possible for the nanophase diamond to form a chemical bond with the substrate. In that case, the film will be bonded to the substrate with an alloyed layer of a thickness between about 5 and 50 nm.

EXAMPLE OF USE

An experiment in which titanium was coated with nanophase diamond showed that a 2.7 micron thick coating of nanophase diamond increased the lifetime of the titanium sample by a factor of better than 200. In no case tested was there any flaking, unbonding, or delamination of the nanophase diamond from the titanium substrate.

The instant invention has been disclosed in connection with specific embodiments. However, it will be apparent to those skilled in the art that variations from the illustrated embodiments may be undertaken without departing from the spirit and scope of the invention. For example, varying quantities of hydrogen and graphite may be present in a nanophase diamond film prepared in accordance with the present invention. In addition, preparation of nanophase diamond films is not necessarily limited to the apparatus and method disclosed herein. These and other variations will be apparent to those skilled in the art and are within the spirit and scope of the invention.

What is claimed is:

1. A nanophase diamond film, comprising nodules of carbon bonded predominantly in three dimensional $sp^3$ bonds, said film comprising less than about 20% hydrogen, having an imaginary index of refraction less than 0.5 for a light wavelength of about 632.8 nm, and said nodules having a diameter of less than about 500 angstroms, wherein said film is chemically bonded with a substrate.

2. The nanophase diamond film of claim 1, wherein said film is bonded to a substrate with an alloyed layer.

3. The nanophase diamond film of claim 2, wherein said alloyed layer has a thickness between about 5 nm to about 50 nm.

4. A nanophase diamond film forming a layer upon a surface of a substrate, comprising nodules of carbon bonded predominantly in three dimensional $sp^3$ bonds, said film comprising less than about 20% hydrogen, having an imaginary index of refraction less than 0.5 for a light wavelength of about 632.8 nm, and said nodules having a diameter of less than.

* * * * *

UNITED STATES PATENT AND TRADEMARK OFFICE
CERTIFICATE OF CORRECTION

PATENT NO. : 5,478,650
DATED : December 26, 1995
INVENTOR(S) : FARZIN DAVANLOO and CARL B. COLLINS It is certified that error appears in the above-indentified patent and that said Letters Patent is hereby corrected as shown below:

In claim 4, line 47, after "than", add -- about 500 angstroms, said film having an optical quality capable of providing a visual appearance of Newton's rings of interference.

Signed and Sealed this

Third Day of September, 1996

Attest:

BRUCE LEHMAN

Attesting Officer          Commissioner of Patents and Trademarks